(12) United States Patent
Halbritter et al.

(10) Patent No.: US 10,283,929 B2
(45) Date of Patent: May 7, 2019

(54) SEMICONDUCTOR LASER DEVICE AND CAMERA

(71) Applicant: OSRAM OPTO Semiconductors GmbH, Regensburg (DE)

(72) Inventors: Hubert Halbritter, Dietfurt (DE); Mario Wiengarten, Woerth an der Donau (DE)

(73) Assignee: OSRAM OPTO Semiconductors GmbH, Regensburg (DE)

( * ) Notice: Subject to any disclaimer, the term of this patent is extended or adjusted under 35 U.S.C. 154(b) by 37 days.

(21) Appl. No.: 15/325,094

(22) PCT Filed: Jun. 16, 2015

(86) PCT No.: PCT/EP2015/063391
§ 371 (c)(1),
(2) Date: Jan. 10, 2017

(87) PCT Pub. No.: WO2016/005150
PCT Pub. Date: Jan. 14, 2016

(65) Prior Publication Data
US 2017/0170625 A1    Jun. 15, 2017

(30) Foreign Application Priority Data

Jul. 10, 2014 (DE) .................. 10 2014 213 406

(51) Int. Cl.
*H01S 5/00* (2006.01)
*H01S 5/022* (2006.01)
(Continued)

(52) U.S. Cl.
CPC .......... *H01S 5/0071* (2013.01); *H01S 5/0226* (2013.01); *H01S 5/02208* (2013.01);
(Continued)

(58) Field of Classification Search
CPC ............... H01S 5/0071; H01S 5/02208; H01S 5/02252; H01S 5/02296; H01S 5/02228
See application file for complete search history.

(56) References Cited

U.S. PATENT DOCUMENTS

2003/0128726 A1\* 7/2003 Tatsuno ............... G11B 7/127
372/36
2003/0169981 A1\* 9/2003 Nakanishi ............ G02B 6/42
385/92
(Continued)

FOREIGN PATENT DOCUMENTS

DE          10345495 B4    11/2010
JP          H08202247 A     8/1996
(Continued)

OTHER PUBLICATIONS

German Search Report based on application No. 10 2014 213 406.4 (8 pages) dated Feb. 19, 2015 (Reference Purpose Only).
(Continued)

*Primary Examiner* — Armando Rodriguez
(74) *Attorney, Agent, or Firm* — Viering Jentschura & Partner MBB

(57) ABSTRACT

Various embodiments may relate to a semiconductor laser device, including at least one laser diode, and at least one reflection surface which reflects diffusely and which is irradiated by the laser diode during operation, and an additional light-nontransmissive housing body having a cutout. The laser diode is the sole light source of the semiconductor laser device. The laser diode is mounted immovably relative to the at least one reflection surface. Light emitted by the semiconductor laser device during operation has the same spectral components as, or fewer spectral components than, light emitted by the laser diode. An interspace between the laser diode and the at least one reflection surface is free of an optical assembly. A light-emitting area of the semicon-
(Continued)

ductor laser device is greater than a light-emitting area of the laser diode by at least a factor of 100.

15 Claims, 8 Drawing Sheets

(51) Int. Cl.
*H04N 3/02* (2006.01)
*H04N 13/254* (2018.01)

(52) U.S. Cl.
CPC ...... *H01S 5/02228* (2013.01); *H01S 5/02252* (2013.01); *H01S 5/02292* (2013.01); *H01S 5/02296* (2013.01); *H04N 13/254* (2018.05); *H01L 2224/48091* (2013.01); *H01S 5/02268* (2013.01); *H01S 5/02288* (2013.01); *H04N 2213/001* (2013.01)

(56) References Cited

U.S. PATENT DOCUMENTS

| | | | |
|---|---|---|---|
| 2004/0066815 A1 | 4/2004 | Okazaki | |
| 2006/0292747 A1 | 12/2006 | Loh | |
| 2008/0252981 A1 | 10/2008 | Yasumoto et al. | |
| 2009/0204109 A1* | 8/2009 | Grove | A61B 18/203 606/9 |
| 2011/0176305 A1* | 7/2011 | Schallmoser | F21V 7/22 362/235 |
| 2012/0288230 A1* | 11/2012 | Pologe | G02B 6/26 385/31 |
| 2013/0201289 A1* | 8/2013 | Billerbeck | H04N 13/20 348/46 |
| 2013/0314937 A1 | 11/2013 | Takahashi et al. | |
| 2014/0098192 A1 | 4/2014 | Park et al. | |

FOREIGN PATENT DOCUMENTS

| | | |
|---|---|---|
| JP | 2005235841 A | 9/2005 |
| JP | 2011181794 A | 9/2011 |
| WO | 2011027596 A1 | 3/2011 |
| WO | 2011108038 A1 | 9/2011 |

OTHER PUBLICATIONS

International Search Report based on application No. PCT/EP2015/063391 (3 pages and 2 pages of English translation) dated Sep. 21, 2015 (Reference Purpose Only).

\* cited by examiner

SEMICONDUCTOR LASER DEVICE AND CAMERA

RELATED APPLICATIONS

The present application is a national stage entry according to 35 U.S.C. § 371 of PCT application No.: PCT/EP2015/063391 filed on Jun. 16, 2015, which claims priority from German application No.: 10 2014 213 406.4 filed on Jul. 10, 2014, and is incorporated herein by reference in its entirety.

TECHNICAL FIELD

A semiconductor laser device is specified. A camera including such a semiconductor laser device is furthermore specified.

SUMMARY

A semiconductor laser device which is efficiently usable in a camera is provided. Furthermore, an optoelectronic semiconductor component which enables a high modulation rate and can be produced in a simple manner is provided.

In accordance with at least one embodiment, the semiconductor laser device includes one or more laser diodes. The at least one laser diode is designed for generating an electromagnetic radiation. The laser diode or laser diodes is/are preferably the sole light sources of the semiconductor laser device. By way of example, the at least one laser diode is designed to emit radiation in the ultraviolet, visible or near-infrared spectral range. If the semiconductor laser device includes a plurality of laser diodes, then it is possible for said laser diodes to emit radiation in the same spectral range or in mutually different spectral ranges or only partly congruent spectral ranges during operation.

In accordance with at least one embodiment, the laser diode includes a semiconductor layer sequence. The semiconductor layer sequence is preferably based on a III-V compound semiconductor material. The semiconductor material is, for example, a nitride compound semiconductor material such as $Al_n In_{1-n-m} Ga_m N$ or a phosphide compound semiconductor material such as $Al_n In_{1-n-m} Ga_m P$ or else an arsenide compound semiconductor material such as $Al_n In_{1-n-m} Ga_m As$, wherein in each case the $0 \leq n \leq 1$, $0 \leq m \leq 1$ and $n+m \leq 1$. In this case, the semiconductor layer sequence may include dopants and additional constituents. For the sake of simplicity, however, only the essential constituents of the crystal lattice of the semiconductor layer sequence, that is to say Al, As, Ga, In, N or P, are indicated, even if these can be replaced and/or supplemented in part by small amounts of further substances.

In accordance with at least one embodiment, the semiconductor laser device includes one or more reflection surfaces. The at least one reflection surface is designed to diffusely reflect the radiation generated by the at least one laser diode. In other words, only a small or no proportion of radiation is reflected specularly, that is to say with the same angle of incidence and angle of reflection, at the reflection surface. A specularly reflected proportion of radiation is then, for example, at most 10% or 5% or 2.5% of the total reflected radiation power. The reflection surface has a reflectivity of at least 80% or 90% or 94% for the light from the at least one laser diode.

In accordance with at least one embodiment, the at least one reflection surface is irradiated by the laser diode during the operation of the semiconductor laser device. This can mean that the entire or at least 95% or 90% or 80% of the radiation emitted by the at least one laser diode during operation passes to the diffusely reflective reflection surface and is diffusely reflected at the reflection surface. If the semiconductor device includes a plurality of reflection surfaces, then these can be fashioned in each case identically with regard to the reflection properties or else have different reflection properties, for example with regard to a spectrally dependent reflectivity.

In accordance with at least one embodiment, the laser diode or laser diodes is/are mounted immovably relative to the reflection surface or reflection surfaces. In other words, a beam position of the at least one laser diode is not changeable relative to the at least one reflection surface during use of the semiconductor laser device as intended. In particular, both the laser diode and the reflection surface are arranged rigidly and immovably. Furthermore, preferably no devices for beam deflection, in particular for scanning the light emitted by the laser diode, are situated between the laser diode and the reflection surface. Here in this context and hereinafter the term light includes ultraviolet radiation and near-infrared radiation.

In accordance with at least one embodiment, a light emitted by the semiconductor laser device during the operation of the semiconductor laser device has the same spectral components as, or fewer spectral components than, light emitted by the at least one laser diode. In particular, the semiconductor laser device is free of a conversion medium for partly or completely converting the light emitted by the laser diode into radiation having a different wavelength. In particular, the light emitted by the semiconductor laser device has the same spectral composition as the light emitted by the at least one laser diode. A spectral narrowing with regard to the light emitted by the laser diode is possible for example by means of filters disposed downstream of the laser diode or by means of a spectrally dependent reflectivity of the reflection surface.

In accordance with at least one embodiment, an interspace between the at least one laser diode and the at least one reflection surface is free of an optical assembly. An optical assembly is, for example, a refractively or reflectively acting device for beam shaping. Such an optical assembly can be, for example, a converging lens or a diverging lens or else a mirror with or without a curvature.

In accordance with at least one embodiment, a light-emitting area of the semiconductor laser device is greater than a light-emitting area of the at least one laser diode. A difference in size between these light-emitting areas is, for example, at least a factor of 10 or 50 or 100 or 200 or 400 or 1000.

In at least one embodiment, the semiconductor laser device includes at least one laser diode and at least one reflection surface. The reflection surface reflects diffusely and is irradiated by the at least one laser diode during operation. The at least one laser diode serves as the sole light source of the semiconductor laser device. The at least one laser diode is mounted immovably relative to the at least one reflection surface. Light emitted by the semiconductor laser device during operation has the same spectral components as, or fewer spectral components than, light emitted by the at least one laser diode. An interspace between the at least one laser diode and the at least one reflection surface is free of an optical assembly. A light-emitting area of the semiconductor laser device is greater than a light-emitting area of the at least one laser diode by at least a factor of 100.

Lasers, in particular laser diodes, are used in many applications, for example in the three-dimensional recognition of objects. In this case, laser diodes are distinguished especially by lower switching times and by a higher modulation rate, in comparison with incoherent semiconductor-based light sources such as light emitting diodes, LEDs for short. Furthermore, laser diodes have a narrower emission spectrum in comparison with light emitting diodes. On the other hand, some properties of laser diodes are not required, or even undesirable in some applications. In this regard laser diodes usually have a comparatively small emission angle and a directional emission characteristic. A uniform illumination of surfaces is often desired in applications in cameras. However, a Lambertian emission characteristic is desired for a uniform illumination of surfaces. Increased eye safety requirements likewise have to be satisfied in the case of laser diodes. Therefore, LEDs are often used for illumination in the case of image acquisition.

In the case of the semiconductor laser device specified, on the one hand, properties such as a narrow emission spectrum and high switching times can be combined with a spatially relatively wide emission characteristic. By means of the wide emission characteristic, a more uniform illumination can be achieved, and the eye safety requirements can be reduced. In the case of the semiconductor laser device described, this is achieved, in particular, by means of the diffusely reflective reflection surface.

An alternative possibility for varying an emission characteristic of a laser diode is afforded, for example, by using an optical assembly having a plurality of optical components in combination with a diffuser lamina. In order to obtain the desired emission characteristic, however, such a diffuser lamina has to effect a comparatively high degree of scattering. On account of then unavoidable backscattering, however, an efficiency of such a device including a diffuser lamina is reduced. Furthermore, a housing construction of the semiconductor laser device can be simplified by the use of the reflection surface.

In accordance with at least one embodiment, the semiconductor laser device includes one or more housing bodies. The at least one housing body is preferably formed from a light-nontransmissive material. In other words, a radiation emitted by the laser diode preferably cannot pass through the housing body.

In accordance with at least one embodiment, the housing body has at least one cutout. The cutout is designed to receive the laser diode. Preferably, the laser diode is situated completely in the cutout. If a plurality of laser diodes are present, then a plurality of laser diodes can be grouped in one cutout or all the laser diodes are situated in a single cutout or a respective laser diode is assigned to exactly one cutout.

In accordance with at least one embodiment, the reflection surface is formed by part of a housing wall of the housing body, in particular by part of a delimiting surface of the cutout. As a result, the reflection surface can be produced in an efficient manner. It is possible for the reflection surface to be formed from a material of the housing body and to be free of a coating. Alternatively, it is possible for the reflection surface to be a region of the housing body provided for reflection which is provided with a coating, for instance for increasing a reflectivity.

In accordance with at least one embodiment, the housing body and/or the housing wall and/or the reflection surface are/is formed from a plastic. The surface of the housing body shaped from plastic can be configured as a diffuse reflection surface.

By way of example, a plastic which appears white to an observer is involved. The plastic is, for example, a polyphthalamide, PPA for short, a polymethyl methacrylate, PMMA for short, a polycarbonate, PC for short, a polystyrene, PS for short, or a polyether ether ketone, PEEK for short.

In accordance with at least one embodiment, the cutout in the housing body has a side wall and a base surface. The side wall and the base surface can be formed from the same material, for example from the white plastic. Alternatively, it is possible for the base surface to be formed from a metal and to include electrical connection areas for connecting the at least one laser diode. Furthermore, the base surface can be at least partly formed from a metal and include electrical connection areas for mechanically and electrically contacting the at least one laser diode. Alternatively or additionally, such connection areas can be provided on the side wall. Preferably, however, all regions of the housing wall which are accessible to the light emitted by the laser diode and/or which are irradiated by the laser diode are formed from a diffusely reflective plastic.

The laser diode is electrically conductively fixed on a first connection area of the side wall for example by means of soldering or adhesive bonding. In this case, it is also possible for the laser diode to be electrically conductively applied on an intermediate carrier, which is then in turn electrically conductively applied on the first electrical connection area. The intermediate carrier is produced from metal, for example, and serves as a heat sink.

Furthermore, the laser diode is electrically conductively contacted with a second electrical connection area on the front side preferably with a bonding wire. In this case, the second electrical connection area is preferably likewise arranged on the side wall. Particularly preferably, the second electrical connection area is arranged on the side wall in such a way that the bonding wire is not impinged on by the light of the laser diode.

For mounting the laser diode onto the side wall of the housing, the housing is preferably rotated in such a way that the perturbational force acts perpendicularly on the side wall. Colloquially speaking, the housing is preferably rotated such that the side wall becomes located at the bottom and, during mounting, is thus situated in the same position as the base surface of a housing if the latter is intended to be provided with the laser diode. In this way, both housings whose base surfaces are intended to be provided with a laser diode and housings whose side walls are intended to be provided with a laser diode can be processed in the same machine.

In accordance with at least one embodiment, the at least one laser diode is fitted on the side wall. The reflection surface is then preferably situated on the base surface. A main emission direction of the laser diode is then preferably directed in a direction away from a light exit side of the semiconductor laser device. It is possible for the laser diode to irradiate principally the base surface and partly a side wall as well.

If the laser diode is fitted on the side wall, then in accordance with one embodiment it is provided that a light-emitting area of the semiconductor laser device is situated opposite the base surface, while the side wall with the laser diode runs perpendicularly or in an inclined fashion with respect to the light-emitting area. In this embodiment, furthermore, a mounting surface of the semiconductor device runs substantially parallel to the light-emitting area of the semiconductor laser device. In other words, the semiconductor laser device is preferably a top-looker.

In this case, the side wall of the semiconductor device can be designed to be inclined by an acute angle $\beta$ with respect to the surface normal of the light-emitting area. By way of example, β has a value of between 20° and 80° inclusive. Preferably, β has a value of between 40° and 70° inclusive.

The housing can be produced using a premold technique, for example, in which a plastics compound is injection-molded around a prefabricated leadframe. In order to produce housings having electrical connection areas on the side wall, a leadframe having a correspondingly bent shape, for instance, is used for this purpose.

Furthermore, the housing can also be produced by means of the MID technique (molded interconnect device technique). Mask methods can be used here in particular for producing housings having electrical connection areas on the side wall.

In accordance with at least one embodiment, the at least one laser diode is fitted on the base surface of the cutout. The at least one reflection surface is then situated on the side wall of the cutout. In this case, it is not necessary for the side wall to be fashioned identically or around the cutout, in particular to have an identical height and/or material composition. A height of the side wall can be increased in the region of a partial area of the side wall which is irradiated by the laser diode.

In accordance with at least one embodiment, the reflection surface has a curvature. A divergence angle of the radiation impinging on the curvature from the at least one laser diode is preferably increased by the curvature, in comparison with a reflection surface of planar design. In particular, the reflection surface is convexly curved, in a manner similar to a mirror having a light-expanding effect. The reflection surface can have different curvatures along different spatial directions.

In accordance with at least one embodiment, the reflection surface is provided with a roughening. If the reflection surface is part of a delimiting surface of the cutout in the housing body, then selectively the reflection surface or else the entire delimiting surface can be provided with the roughening.

In accordance with at least one embodiment, the roughening has a mean roughness of at least 5 µm or 10 µm or 25 µm. Furthermore, the mean roughness can be at most 400 µm or 200 µm or 100 µm or 40 µm.

In accordance with at least one embodiment, the semiconductor laser device includes a radiation-transmissive and preferably transparent potting material. The potting material is arranged at least partly around the laser diode and can be in direct contact with the laser diode. In particular, the potting material can cover a radiation exit surface of the laser diode. The laser diode can be completely embedded into the potting material, such that the laser diode is then completely enclosed by the potting material together with the housing body.

In accordance with at least one embodiment, the potting material partly or, preferably, completely fills a region between the reflection surface and the associated laser diode. That is to say that a region which is filled completely and preferably also homogeneously with the potting material is then situated between the reflection surface and the laser diode. In this case, there may be no refractive index jumps present between the laser diode and the reflection surface.

In accordance with at least one embodiment, a diffusion medium is applied on the potting material and/or above the cutout at least in places. The diffusion medium is designed for scattering the radiation generated by the laser diode. Preferably, the diffusion medium is disposed optically downstream of the reflection surface, such that a radiation from the laser diode passes firstly to the reflection surface and only afterward to the diffusion medium. Preferably, the diffusion medium has only a comparatively low haze, such that a backscattering from the diffusion medium in a direction back to the laser diode is preferably negligible. In particular, the diffusion medium has a haze of at most 0.4 or 0.6.

In accordance with at least one embodiment, the diffusion medium is a scattering film. Alternatively, it is possible for the diffusion material to include scattering particles embedded into a matrix material.

In accordance with at least one embodiment, the potting material is free of the diffusion medium. The potting material is then not designed for scattering light.

In accordance with at least one embodiment, the laser diode or all the laser diodes is or are red-emitting laser diodes. This can mean that an emission maximum is at a wavelength of at least 605 nm or 615 nm and/or at most 680 nm or 660 nm or 640 nm. Alternatively or additionally, at least one laser diode emits in the near-infrared spectral range, that is to say in particular in the spectral range of between 700 nm and 1500 nm, for example at at least 800 nm or 830 nm or 850 nm or 895 nm and/or at at most 870 nm or 925 nm or 980 nm.

In accordance with at least one embodiment, the semiconductor laser device has an optical emission power that is at least 50 mW or 100 mW or 200 mW. Furthermore, the emission power can be at most 5 W or 2.5 W or 1 W or 0.6 W. The emission power is, in particular, the photometric power.

In accordance with at least one embodiment, the at least one laser diode is an edge emitting semiconductor laser diode. The laser diode then preferably emits in a direction perpendicular to a growth direction of a semiconductor layer sequence of the laser diode. An emission region at a side surface of the laser diode is preferably small in comparison with a total area of the side surfaces. Alternatively, the laser diode can also be a surface emitting semiconductor laser diode, which emits in a direction parallel to a growth direction of a semiconductor layer sequence. Furthermore, the laser diode can be a disk laser that emits radiation substantially in all directions perpendicularly to a growth direction.

In accordance with at least one embodiment, the light emitted by the semiconductor laser device during operation is incoherent radiation. Incoherent radiation can mean that a coherence length of the emitted light is at most 50 µm or 20 µm or 5 µm.

In accordance with at least one embodiment, the at least one laser diode emits the light at at least or at exactly two mutually opposite side surfaces of the laser diode. By way of example, a laser diode having two partly light-transmissive facets or resonator mirrors is then involved.

In accordance with at least one embodiment, the semiconductor laser device and/or the reflection surface have/has a Lambertian emission characteristic. That can mean that an emission intensity $I(\alpha)$ as a function of an angle $\alpha$ relative to a direction along which a maximum intensity $I_{max}$ is emitted behaves as follows: $I(\alpha)=I_{max}\cos(\alpha)$. This relationship holds true in particular with a tolerance of at most 0.15 $I_{max}$ or 0.10 $I_{max}$ or 0.05 $I_{max}$.

In accordance with at least one embodiment, the at least one laser diode or a plurality of laser diodes is or are fitted on one or on a plurality of intermediate carriers. Preferably, the at least one intermediate carrier is situated between the base surface of the cutout and the at least one laser diode. The at least one laser diode is preferably electrically and also thermally and mechanically contacted by way of the intermediate carrier.

A camera is furthermore specified. The camera includes one or more semiconductor laser devices as specified in conjunction with one or more of the embodiments mentioned above. Features of the camera are therefore also disclosed for the semiconductor laser device, and vice versa.

In at least one embodiment, the semiconductor laser device of the camera is designed to be driven with a clock frequency of at least 10 MHz or 20 MHz or 50 MHz or 80 MHz. A time period within which the semiconductor laser device is switchable from an off state into an on state, and vice versa, is preferably at most 20 ns or 10 ns or 5 ns or 2.5 ns.

In accordance with at least one embodiment, the camera is a so-called 3D camera. In other words, three-dimensional images can be recorded by the camera. In particular, a camera for recording three-dimensional images according to the time-of-flight method is involved.

In accordance with at least one embodiment, the camera includes one or more sensors for image detection. The sensor is preferably a so-called CCD chip.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
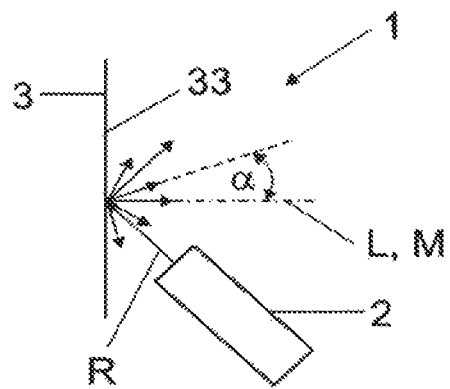
FIGS. 1 to 5 and 8 show schematic illustrations of exemplary embodiments of semiconductor laser devices.

An exemplary embodiment of a semiconductor laser device 1 is illustrated in a schematic sectional illustration in FIG. 1. The semiconductor laser device 1 includes a laser diode 2, which emits a radiation R. The radiation R is preferably laser radiation, in particular in the red and/or infrared spectral range.

Furthermore, the semiconductor laser device 1 includes a reflection surface 3. The reflection surface 3 is irradiated by the laser diode 2. By way of example, the reflection surface 3 is provided with a roughening 33. The radiation R is diffusely reflected via the reflection surface 3.

The scattered radiation R is emitted by the reflection surface 3 preferably in a Lambertian emission characteristic. That is to say that an intensity emitted from an angle $\alpha$ with respect to a perpendicular L and with respect to a main emission direction M of the semiconductor laser device 1 is approximately proportional to the cosine of said angle times a maximum intensity that is emitted along the main emission direction M.

Figure 2A:
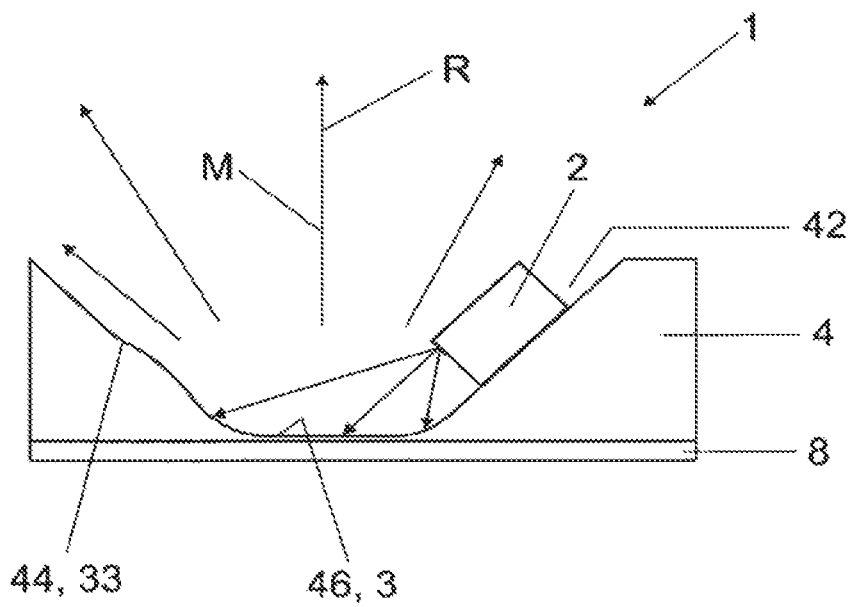

FIG. 2A shows a further exemplary embodiment of the semiconductor laser device 1 in a sectional illustration. The semiconductor laser device 1 additionally includes a housing body 4 having a cutout 42. The laser diode 2 is fitted completely in the cutout 42. Otherwise the cutout 42 is filled for example with a gas such as air.

The laser diode 2 is fitted on a side wall 44 of the cutout 42. The radiation R is emitted by the laser diode 2 in a direction toward a base surface 46 of the cutout 42. Consequently, the laser diode 2 emits in a direction away from the main emission direction M of the semiconductor laser device 1.

The housing body 4 is shaped for example from a radiation-nontransmissive, white and reflective plastic. The side walls 44 and the base surface 46 are optionally provided with the roughening 33. Both the side walls 44 and the base surface 46 are formed from a material of the housing body.

For electrically contacting the semiconductor laser device 1, an electrical and optionally simultaneously thermal contact layer 8 is optionally fitted on an underside of the housing body 4. The contact layer 8 is a metallic layer, for example. Further electrical lines and electrical connection means for electrically interconnecting the laser diode 2 are not depicted, in order to simplify the illustration.

A light-emitting area of the semiconductor laser device 1 is formed in particular by the opening of the cutout 42 at a side of the housing body 4 facing away from the base surface 46.

Figure 2B:
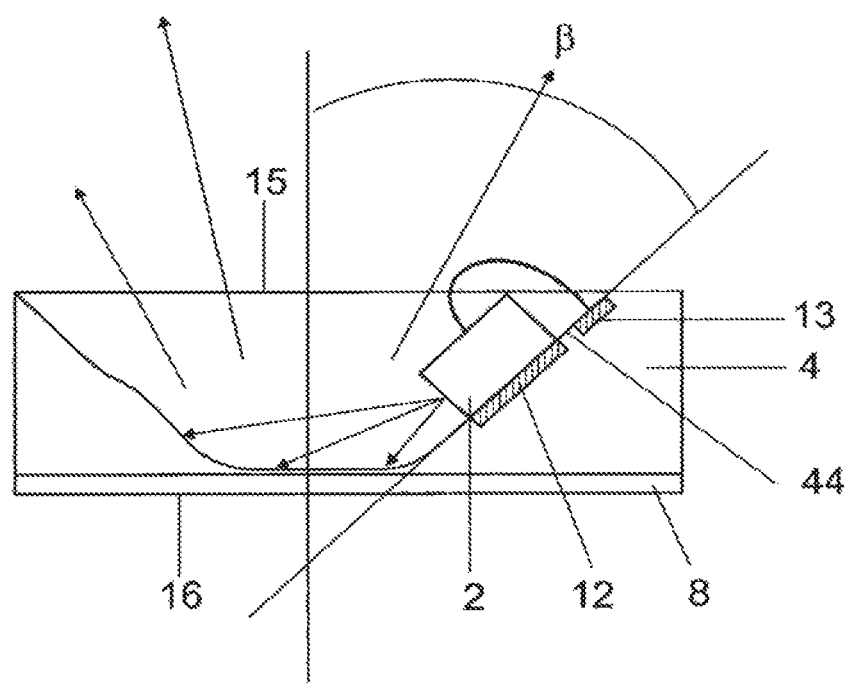

FIG. 2B shows a further schematic sectional illustration of the semiconductor laser device 1 in accordance with the exemplary embodiment in FIG. 2A. The semiconductor device 1 includes a housing body 4 having a side wall 44 provided with a first electrical connection area 12 and a second connection area 13. The laser diode 2 is electrically conductively mounted onto the first connection area 12 and is electrically conductively connected to the second connection area 13 by means of a bonding wire 14. In this case, the second connection area 13 is arranged in an outer region of the side wall 44 in order that the bonding wire 14 is not impinged on by the light of the laser diode 2.

In the case of the semiconductor device 1 in accordance with the exemplary embodiment in FIGS. 2A and 2B, the side wall 44 is inclined such that it forms an acute angle $\beta$ with a normal to a light-emitting area 15 of the semiconductor device 1, said angle having for example one of the values mentioned in the general part of the description. The light-emitting area 15 in this case is situated opposite a mounting surface 16 of the semiconductor device 1 and runs parallel thereto. The semiconductor laser device 1 is a top-looker.

Figure 3A:
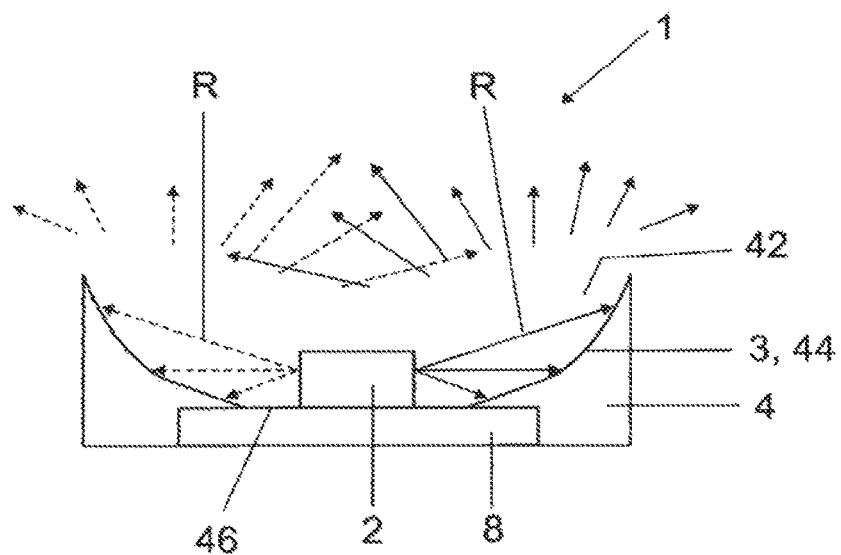
Figure 3B:
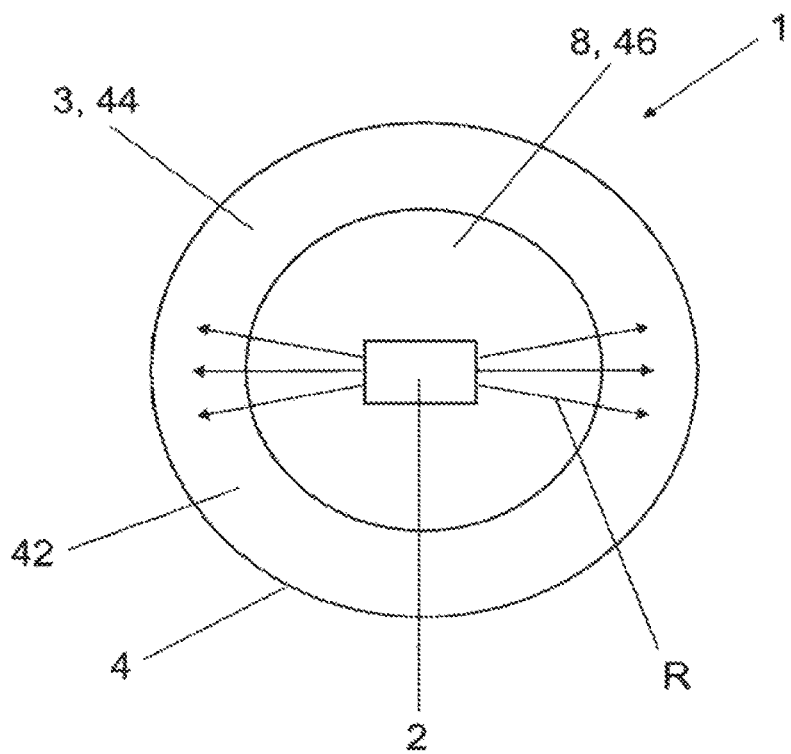

In the further exemplary embodiment, see the sectional illustration in FIG. 3A and the plan view in FIG. 3B, the laser diode 2 at the base surface 46 is fitted directly on the contact layer 8. The contact layer 8 can be, for example, a printed circuit board, a metal-core circuit board or a leadframe having a plurality of metallic parts.

The laser diode 2 illustrated in FIGS. 3A and 3B emits the radiation R at two mutually opposite edges. The laser diode 2, as also possible in all the other exemplary embodiments, is an edge emitting semiconductor laser diode.

In contrast to the illustration shown, it is possible for a plurality of the laser diodes 2 to be arranged in the semiconductor laser device 1. This is also possible in association with all the other exemplary embodiments. By way of example, the base surface 46 is irradiated by a plurality of laser diodes 2 which are mounted on different regions of the side walls 44 and which can in each case emit radiation having the same spectral composition or different spectral compositions; also cf. FIG. 2.

Figure 4:
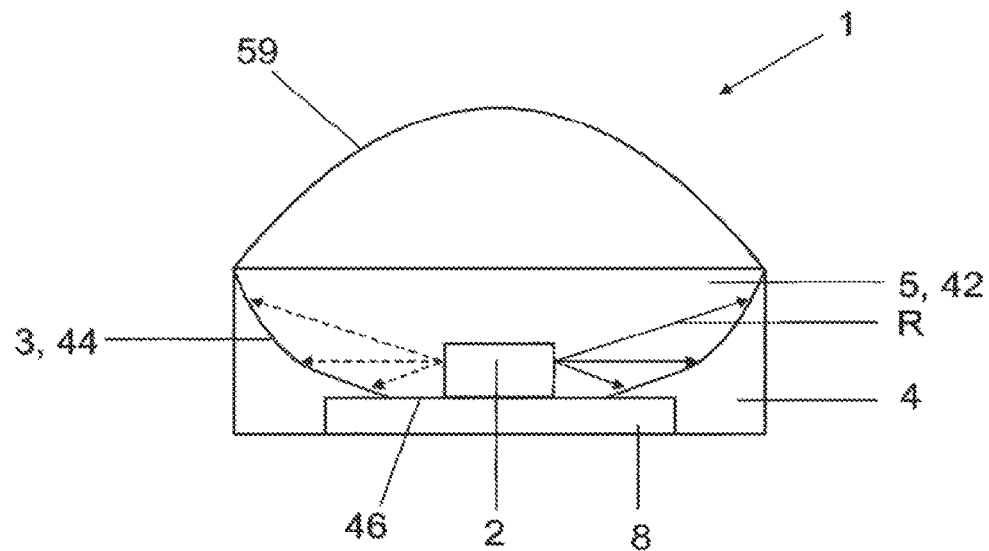

The sectional illustration in accordance with FIG. 4 shows an exemplary embodiment of the semiconductor laser device 1 in which the cutout 42 is optionally filled with a potting material 5. The potting material 5 is, for example, a transparent, radiation-transmissive material, for instance a silicone or an epoxy. The laser diode 2 is completely enclosed by the potting material 5 together with the housing body 4. The potting material 5 is in direct contact with the laser diode 2.

Furthermore, an optical assembly 59 in the form of a converging lens is optionally applied on a side of the potting material 5 facing away from the laser diode 2. In contrast to the illustration shown, the converging lens 59 can have a larger diameter than a side of the cutout 42 facing away from the base surface 46.

Figure 5:
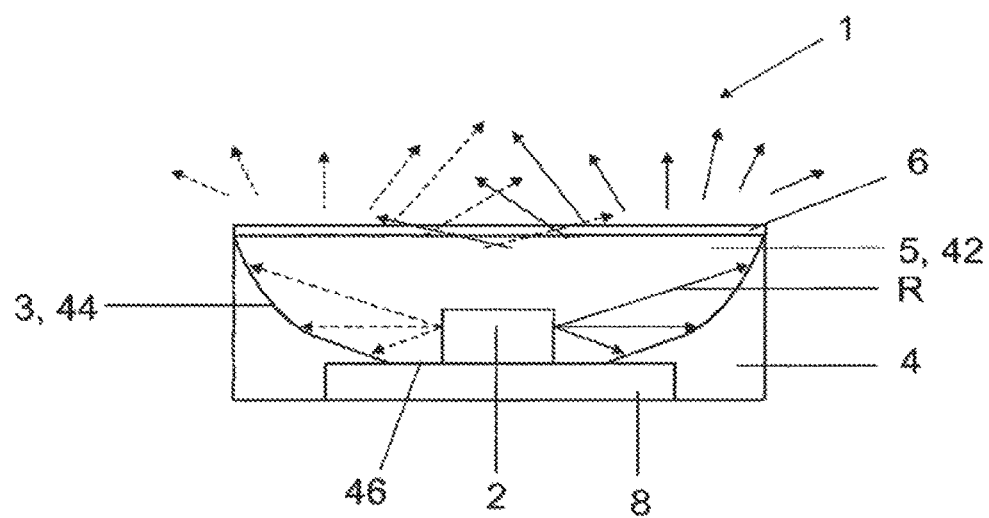

In the further exemplary embodiment, see the sectional illustration in FIG. 5, a diffusion medium 6 is disposed downstream of the cutout 42. The diffusion medium 6 is, for example, a scattering film or a further potting material into which light-scattering particles are embedded. A scattering effect of the diffusion medium 6 is preferably relatively small. An emission characteristic of the semiconductor laser device 1 can be set further by means of the diffusion medium 6.

In contrast to the illustration shown, it is possible for more highly scattering or light-nontransmissive regions to be provided on or in the diffusion medium 6. By means of such light-nontransmissive regions (not depicted), specular reflections of the radiation R that possibly occur at the reflection surface 3 can be filtered out or suppressed or reduced. Such specular reflections occur for example on account of a difference in refractive index between a material in the cutout 42 and a material of the housing body 4. Such a difference in refractive index and associated specular reflections can also be reduced or eliminated by the potting material 5.

Figure 6:
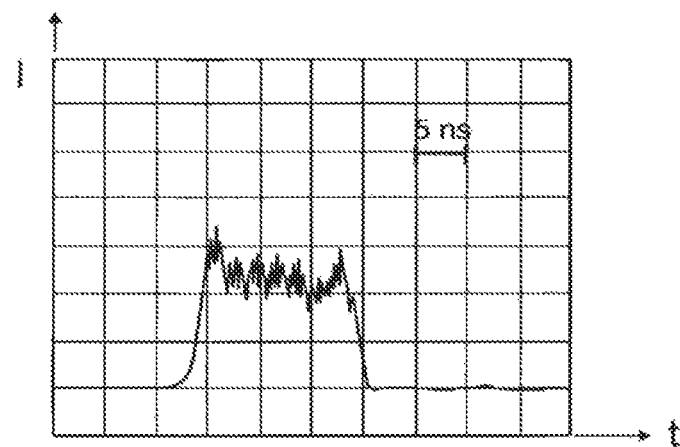
FIG. 6 shows a schematic illustration of a time behavior of exemplary embodiments of semiconductor laser devices.

FIG. 6 illustrates a profile of an intensity I of an emission of the semiconductor device 1 as a function of time t. On account of the use of the laser diode 2, switching can be effected rapidly from an off state into an on state, for example with a time constant of less than 1 ns or of less than 2 ns. A rapid intensity modulation of the radiation emitted by the semiconductor laser device 1 is achievable as a result.

Figure 7:
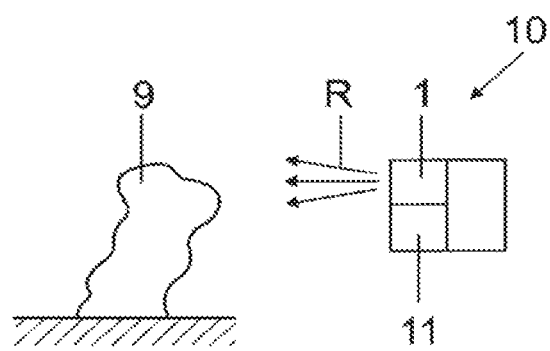
FIG. 7 shows a schematic illustration of an exemplary embodiment of a camera.

FIG. 7 schematically illustrates a camera 10 including a semiconductor laser device 1. The camera 10 is a 3D camera according to the time-of-flight principle. The radiation R is emitted by the semiconductor laser device 1 in a direction toward an object 9. At the object 9, the radiation R is reflected and is subsequently picked up by at least one detector 11. By means of a time-of-flight measurement of the radiation R from the semiconductor laser device 1 via the object 9 back toward the detector 11, it is possible to determine a distance from specific regions of the object 9 to the camera 10. A high three-dimensional resolution is achievable on account of the rapid modulability of the radiation emission of the semiconductor laser device 1.

Figure 8:
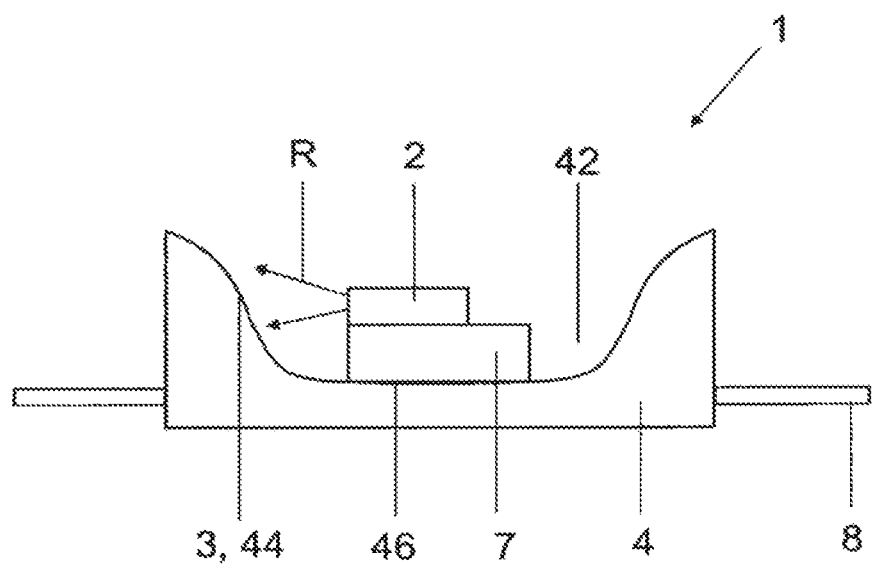

A further exemplary embodiment of the semiconductor laser device 1 can be seen in the sectional illustration in accordance with FIG. 8. As also in all the other exemplary embodiments, it is possible for the reflection surface 3 to be curved in order to increase a divergence of the radiation R impinging on the reflection surface 3. In particular, the reflection surface 3 is convexly curved along one or along two orthogonal spatial directions.

A region between the laser diode 2 and the reflection surface 3 is free of an optical assembly. Divergent laser radiation R is correspondingly emitted by the laser diode 2. On account of the divergence of the radiation R in association with the diffusely reflective reflection surface 3, a beam cross section at a light exit opening of the semiconductor laser device 1 increases greatly in comparison with a radiation-emitting area directly at the laser diode 2.

Optionally, as also in all the other exemplary embodiments, an intermediate carrier 7, also designated as submount, is situated between the housing body 4 and the laser diode 2. The intermediate carrier 7 can function as a heat sink. It is likewise possible for further electronic elements such as integrated circuits, protective diodes against damage as a result of electrostatic discharges, or memory components to be integrated in the intermediate carrier 7, in order to ensure or to simplify a high-frequency, fast driving of the laser diode 2.

In accordance with FIG. 8, the contact layers 8 are led out laterally from the housing body 4. The contact layers 8 can likewise be led in the direction of a base side of the housing body 4.

Figure 9:
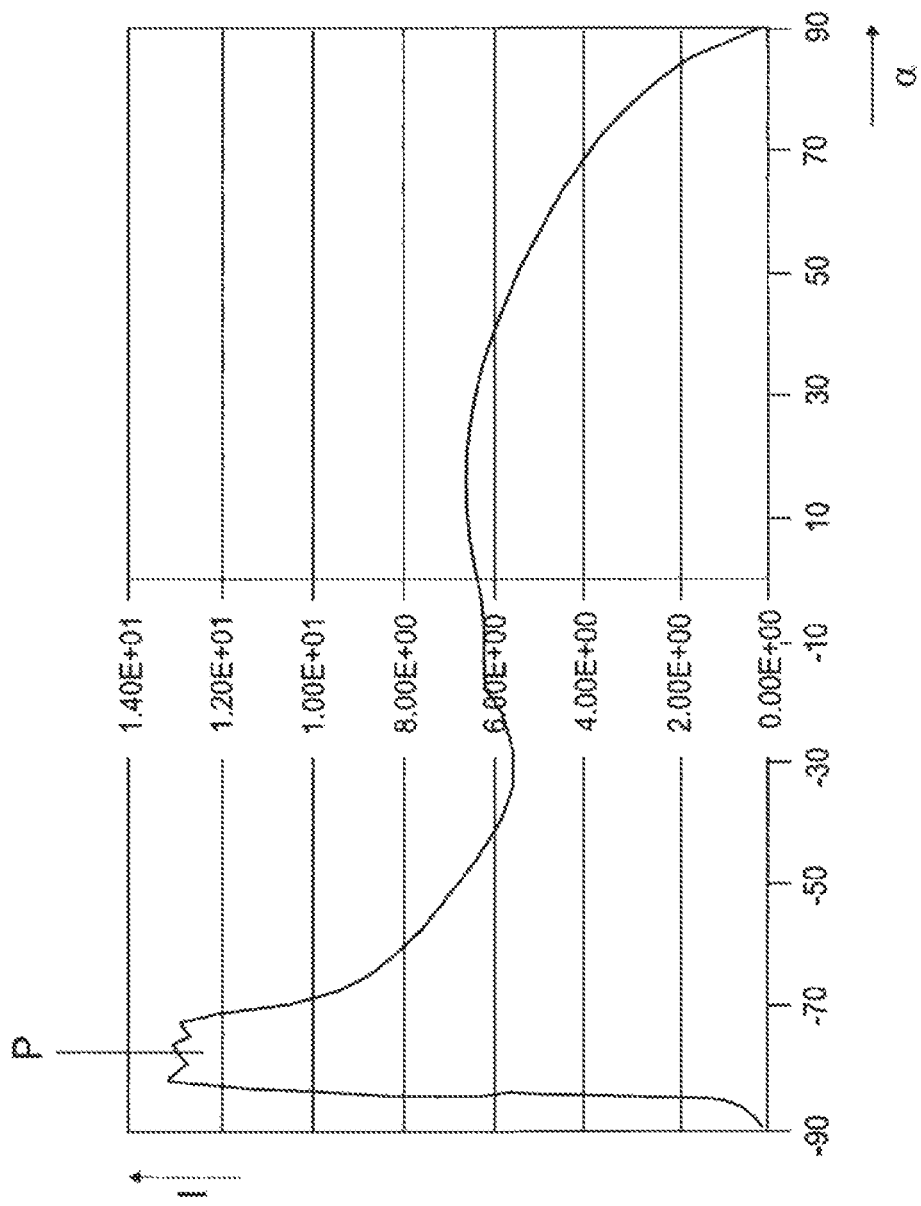
FIGS. 9 and 10 show schematic illustrations of a spatial emission characteristic of exemplary embodiments of semiconductor laser devices.
Figure 10:
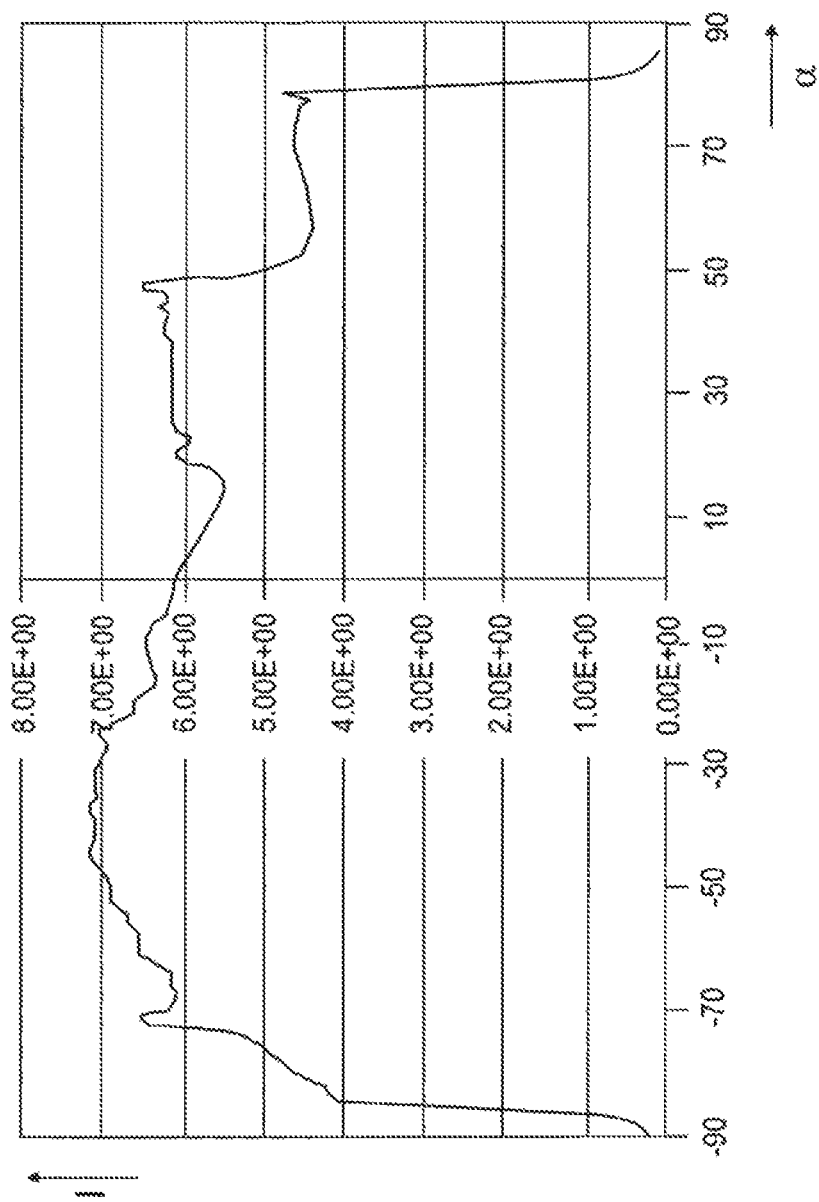

FIGS. 9 and 10 illustrate angle-dependent intensity distributions. In accordance with FIG. 9, the intensity distribution has a Lambertian profile in an angle range of approximately −40° to 90°. By way of example, a semiconductor laser device 1 as illustrated in conjunction with FIG. 8 is used. A strong intensity band P originates from a radiation shooting across the side walls 44 of the housing body 4. Such a band P can be avoided by appropriate design of the side walls 44. By way of example, the housing body 4 can be higher in the region of the reflection surface 3 compared with regions which are not irradiated directly by the laser diode.

FIG. 10 shows the emission characteristic of a device as specified for example in conjunction with FIGS. 2A and 2B. With a comparatively low tolerance, the emission characteristic follows a Lambertian characteristic across an entire angle range.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A semiconductor laser device comprising:
   at least one laser diode, and
   at least one reflection surface which reflects diffusely and which is irradiated by the at least one laser diode during operation, and
   an additional light-nontransmissive housing body having a cutout
   wherein
   the at least one laser diode is the sole light source of the semiconductor laser device,
   the at least one laser diode is mounted immovably relative to the at least one reflection surface,
   light emitted by the semiconductor laser device during operation has the same spectral components as, or fewer spectral components than, light emitted by the at least one laser diode,
   an interspace between the at least one laser diode and the at least one reflection surface is free of an optical assembly,
   a light-emitting area of the semiconductor laser device is greater than a light-emitting area of the at least one laser diode by at least a factor of 100, the at least one laser diode is fitted in the cutout,
the reflection surface is part of a housing wall of the housing body in the cutout,
the housing body and the reflection surface are formed from a plastic,
the cutout has a side wall and a base surface, and
the laser diode is fitted on the side wall and the reflection surface is situated on the base surface;
wherein the semiconductor laser device further comprises a radiation-transmissive, transparent potting material, wherein the potting material completely fills a region between the reflection surface and the at least one laser diode, and the at least one laser diode is at least partly embedded into the potting material, and
wherein a diffusion medium is applied to the potting material at least in places,
wherein the diffusion medium is formed by scattering particles embedded into a matrix material, and wherein the potting material is free of the diffusion medium.

2. The semiconductor laser device as claimed in claim 1, wherein the plastic is designed to be diffusely reflective.

3. The semiconductor laser device as claimed in claim 1, wherein the reflection surface has a curvature, such that a divergence angle of the radiation impinging on the curvature from the at least one laser diode is increased on account of the curvature.

4. The semiconductor laser device as claimed in claim 1, wherein the reflection surface is provided with an irregular roughening,
wherein a mean roughness of the roughening is between 5 μm and 200 μm inclusive.

5. The semiconductor laser device as claimed in claim 1, wherein the at least one laser diode has an emission maximum in the wavelength range of between 605 nm and 660 nm inclusive or between 830 nm and 925 nm inclusive,
wherein an optical emission power of the semiconductor laser device is between 50 mW and 2.5 W inclusive, and
wherein the semiconductor laser device is free of a wavelength conversion medium.

6. The semiconductor laser device as claimed in claim 1, wherein the at least one laser diode is an edge emitting semiconductor laser diode,
wherein incoherent light is emitted by the semiconductor laser device during operation.

7. The semiconductor laser device as claimed in claim 1, which, with a tolerance of at most 0.15 $I_{max}$, exhibits an emission intensity I(α) as a function of an angle α relative to a direction along which the maximum intensity $I_{max}$ is emitted which is given by the following relationship:

$$(\alpha)=I_{max} \cos(\alpha).$$

8. The semiconductor laser device as claimed in claim 1, wherein a time period within which the semiconductor laser device is switchable from an off state into an on state, and vice versa, is less than 20 ns.

9. A camera for recording three-dimensional images according to the time-of-flight method comprising at least one semiconductor laser device, the semiconductor laser device comprising:
at least one laser diode, and
at least one reflection surface which reflects diffusely and which is irradiated by the at least one laser diode during operation, and
an additional light-nontransmissive housing body having a cutout
wherein
the at least one laser diode is the sole light source of the semiconductor laser device,
the at least one laser diode is mounted immovably relative to the at least one reflection surface,
light emitted by the semiconductor laser device during operation has the same spectral components as, or fewer spectral components than, light emitted by the at least one laser diode,
an interspace between the at least one laser diode and the at least one reflection surface is free of an optical assembly,
a light-emitting area of the semiconductor laser device is greater than a light-emitting area of the at least one laser diode by at least a factor of 100,
the at least one laser diode is fitted in the cutout,
the reflection surface is part of a housing wall of the housing body in the cutout,
the housing body and the reflection surface are formed from a plastic,
the cutout has a side wall and a base surface, and
the laser diode is fitted on the side wall and the reflection surface is situated on the base surface,
wherein the semiconductor laser device is designed to be driven with a clock frequency of at least 20 MHz.

10. The semiconductor laser device as claimed in claim 1, wherein the reflection surface is convexly curved.

11. The semiconductor laser device as claimed in claim 1, wherein a mounting surface of the semiconductor laser device is substantially parallel to the light-emitting area of the semiconductor laser device.

12. The semiconductor laser device as claimed in claim 1, wherein the coherence length of the light emitted by the semiconductor laser device is at most 50 μm.

13. The semiconductor laser device as claimed in claim 1, wherein the emission power of the semiconductor laser device is at most 5 W.

14. The camera as claimed in claim 9, comprising one or more sensors for image detection.

15. A semiconductor laser device for use in image detection comprising:
a laser diode, and
a reflection surface which reflects diffusely and which is irradiated by the laser diode during operation, and
a light-nontransmissive housing body having a cutout
wherein
the laser diode is mounted immovably relative to the reflection surface,
light emitted by the semiconductor laser device during operation has the same spectral components as, or fewer spectral components than, light emitted by the at least one laser diode,
an interspace between the laser diode and the reflection surface is free of an optical assembly,
a light-emitting area of the semiconductor laser device is greater than a light-emitting area of the laser diode by at least a factor of 100,
the laser diode is fitted in the cutout,
the reflection surface is part of a housing wall of the housing body in the cutout,
the housing body and the reflection surface are formed from a plastic,
the cutout has a side wall and a base surface,
the laser diode is fitted on the side wall and the reflection surface is situated on the base surface, the emission power of the semiconductor laser device is between 50 mW and 2.5 W inclusive, and the coherence length of the light emitted by the semiconductor laser device is at most 20 µm.

* * * * *